US012431470B2

(12) United States Patent
Plank et al.

(10) Patent No.: US 12,431,470 B2
(45) Date of Patent: Sep. 30, 2025

(54) DISPLAY DEVICE AND ELECTRONIC DEVICE INCLUDING THE DISPLAY DEVICE (71) Applicant: Infineon Technologies AG, Neubiberg (DE)

(72) Inventors: Hannes Plank, Graz (AT); Markus Dielacher, Graz (AT); Martin Flatscher, Graz (AT); Heinrich Guenther Heiss, Munich (DE); Robert Lobnik, Bad Eisenkappel (AT); Armin Josef Schoenlieb, Seiersberg-Pirka (AT)

(73) Assignee: Infineon Technologies AG, Neubiberg (DE)

( * ) Notice: Subject to any disclaimer, the term of this patent is extended or adjusted under 35 U.S.C. 154(b) by 994 days.

(21) Appl. No.: 17/524,023

(22) Filed: Nov. 11, 2021

(65) Prior Publication Data
US 2022/0149016 A1    May 12, 2022

(30) Foreign Application Priority Data
Nov. 12, 2020   (EP) .................................... 20207106

(51) Int. Cl.
H01L 25/075 (2006.01)
G01S 7/481 (2006.01)
G01S 17/08 (2006.01)
H01S 5/42 (2006.01)

(52) U.S. Cl.
CPC ........ *H01L 25/0753* (2013.01); *G01S 7/4815* (2013.01); *G01S 17/08* (2013.01); *H01S 5/423* (2013.01)

(58) Field of Classification Search
CPC ... H01L 25/0753; H01L 25/167; G01S 17/08; G01S 7/4815; H01S 5/423; H10H 20/851
See application file for complete search history.

(56) References Cited

U.S. PATENT DOCUMENTS

| 10,796,123 | B2* | 10/2020 | Smith ....................... G06T 7/74 |
| 10,797,202 | B2* | 10/2020 | Danesh ................... H01L 25/50 |
| 11,417,796 | B2* | 8/2022 | Aas ......................... H10H 20/01 |
| 11,417,806 | B2* | 8/2022 | Schrama .............. H10H 20/851 |
| 11,422,661 | B2* | 8/2022 | Yeke Yazdandoost ...................... G06F 3/042 |
| 11,563,151 | B2* | 1/2023 | Lius ................... G06V 40/1318 |
| 11,749,964 | B2* | 9/2023 | Scheller ............. H01S 5/18311 372/50.11 |

(Continued)

FOREIGN PATENT DOCUMENTS

| CN | 111902822 A | 11/2020 |
| DE | 102018119548 A1 | 2/2020 |

OTHER PUBLICATIONS

Infrared, Wikipedia; from Vatansever, Fatma and Hamblin, Michael R. (Jan. 1, 2012(Year: 2012).*

*Primary Examiner* — Vinh T Lam
(74) *Attorney, Agent, or Firm* — Murphy, Bilak & Homiller, PLLC (57) ABSTRACT

A display device is provided. The display device includes a plurality of first light-emitting elements configured to emit light for displaying an optical image on a front side of the display device. Additionally, the display device includes at least one second light-emitting element configured to emit infrared light for illuminating a scene in front of the front side of the display device.

20 Claims, 4 Drawing Sheets (56) References Cited

U.S. PATENT DOCUMENTS

| | | | | |
|---|---|---|---|---|
| 11,882,263 | B2* | 1/2024 | Park | G01S 7/4865 |
| 12,176,331 | B2* | 12/2024 | Plank | G09G 3/3208 |
| 2017/0285366 | A1* | 10/2017 | Longbotham | G02B 23/125 |
| 2017/0337413 | A1* | 11/2017 | Bhat | G06V 40/1347 |
| 2019/0293764 | A1 | 9/2019 | Van Nieuwenhove et al. | |
| 2019/0363792 | A1* | 11/2019 | Tsonev | H02S 40/38 |
| 2020/0126475 | A1* | 4/2020 | Ting | G06F 3/0421 |
| 2020/0218117 | A1* | 7/2020 | Engelen | G02B 6/0068 |
| 2020/0403121 | A1* | 12/2020 | Danesh | H10H 20/856 |
| 2021/0072357 | A1* | 3/2021 | Sun | G06F 3/147 |
| 2021/0175216 | A1* | 6/2021 | Pendse | H01L 24/80 |
| 2021/0248951 | A1* | 8/2021 | Lee | G09G 3/3208 |
| 2022/0036810 | A1* | 2/2022 | Gu | G06T 7/11 |
| 2022/0320050 | A1* | 10/2022 | Zha | H01L 25/167 |
| 2023/0258955 | A1* | 8/2023 | Daiku | G06F 3/0421 |

\* cited by examiner

DISPLAY DEVICE AND ELECTRONIC DEVICE INCLUDING THE DISPLAY DEVICE

TECHNICAL FIELD

The present disclosure relates to a display device and an electronic device comprising the same.

BACKGROUND

Displays of devices like smartphones tend to occupy the complete front side of the device such that optical sensors are located under the display. Many optical sensors use an active illumination unit (e.g. Time-of-Flight, ToF, sensors).

As the average transparency of displays is limited, a lot of light is lost when the illumination units is placed behind the display as the light needs to pass through the display.

Hence, there may be a demand for improved illumination structures.

SUMMARY

The demand may be satisfied by the subject matter of the appended claims.

An example relates to a display device. The display device comprises a plurality of first light-emitting elements configured to emit light for displaying an optical image on a front side of the display device. Additionally, the display device comprises at least one second light-emitting element configured to emit infrared light for illuminating a scene in front of the front side of the display device.

Another example relates to an electronic device. The electronic device comprises a display device as proposed herein and at least one optical sensor configured to measure reflected infrared light from the scene. The display device is arranged between the at least one optical sensor and the scene.

BRIEF DESCRIPTION OF THE FIGURES

Some examples of apparatuses and/or methods will be described in the following by way of example only, and with reference to the accompanying figures, in which.

DETAILED DESCRIPTION

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

Figure 1:
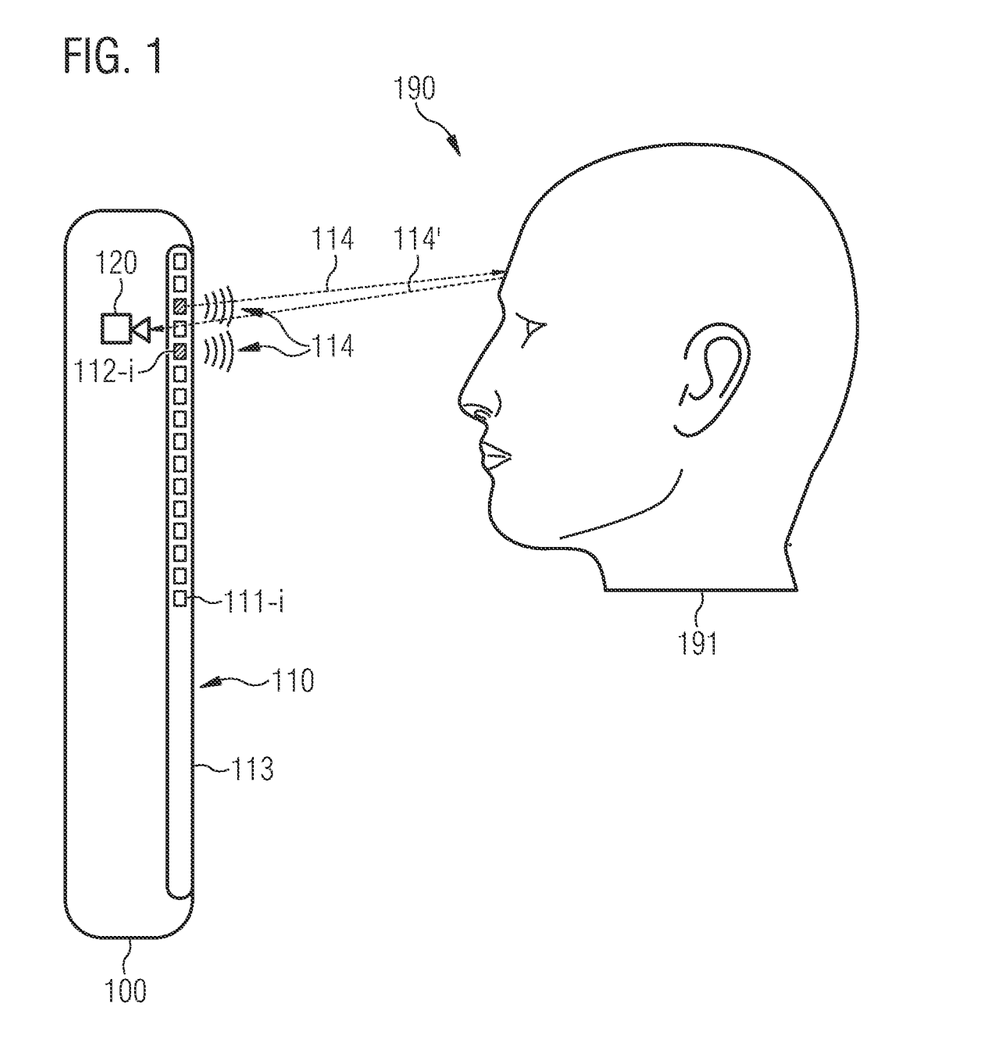
FIG. 1 illustrates an example of an electronic device comprising a display device as proposed herein.

FIG. 1 illustrates an electronic device 100 such as, e.g., a smartphone, a tablet-computer or a laptop-computer. However, it is to be noted that the electronic device 100 may be any other electronic device as well. The electronic device 100 comprises a display device 110. The display device 110 may cover (substantially) the entire front surface of the electronic device 100 as illustrated in FIG. 1. In other examples, the display device 110 may cover only a fraction of the electronic device 100's front surface.

The display device 110 comprises a plurality of first light-emitting elements (circuitries, devices) 111-$i$ for displaying an optical image on a front side 113 of the display device 110. In other words, the display device 110 comprises at least two of the plurality of first light-emitting elements. The front side 113 of the display device 110 is the side of the display device 110 that can be seen by a user of the electronic device 100. For example, the plurality of first light-emitting elements 111-$i$ may be arranged in an array as pixels for displaying the optical image. The display device 110 may be formed according to a display technology. For example, the display device 110 may be a Light Emitting Diode (LED) display, an Organic LED (OLED) display, a Liquid Crystal Display (LCD) or a micro LED display. However, it is to be noted that any other display technology may be used as well for the display device 110. Each of the plurality of first light-emitting elements 111-$i$—may be configured to selectively emit red, green and/or blue light—either directly (e.g. by comprising corresponding LEDs for the different light colors) or indirectly (e.g. using one or more wavelength conversion elements for converting the light emitted by one or more LEDs to red, green or blue light).

Further, the display device 110 comprises at least one second light-emitting element (circuitry, device) 112-$i$ configured to selectively emit infrared light 114 for illuminating a scene 190 in front of the front side 113 of the display device 110 (i.e. the wavelength of the light 114 is between approx. 700 nm and approx. 1.4 µm). In FIG. 1, two second light-emitting elements are illustrated. However, it is to be noted that any other number n≥1 of second light-emitting elements may be used as well.

In the electronic device 100, the elements for illuminating the scene 190 are integrated into the display device 110. Accordingly, the emitted infrared light 114 need not pass through the whole display device 110. Therefore, a power of the infrared light 114 may be reduced compared to conventional under-display illumination structures. As a consequence, a power consumption of the at least one second light-emitting element 112-$i$ may be reduced compared to conventional under-display illumination structures. Further, heating of the display device 110 via the infrared light 114 and, hence, an expansion of the display device 110 may be reduced and also light induced leakage current in under display control circuitry. Therefore, the likelihood of a display damage (e.g. glass fracture) may be reduced.

For example, the at least one second light-emitting element 112-$i$ may be used as illumination unit for an optical sensor 120 of the electronic device 100. The optical sensor 120 is configured to measure (sense) reflected infrared light 114' from the scene 190 (reflections 114' of the emitted light 114 from the scene 190), i.e. the optical sensor 120 is configured to measure the fraction of the infrared light 114 that is reflected back from the scene 190 (e.g. by the head 191). The optical sensor 120 may be sensitive to light of any target (desired) wavelength range(s) including infrared light. The optical sensor 120 may, e.g., comprise a Photonic Mixer Device (PMD) or a Charge-Coupled Device (CCD) for measuring the reflected light 114' from the scene. The optical sensor 120 is arranged within the electronic device 100 at the back side of the display device 110. In other words, the display device 110 is arranged between the optical sensor 120 and the scene 190. Accordingly, the reflected light 114' from the scene 190 transmits through the display device 110 before it reaches the optical sensor 120.

For example, the optical sensor 120 may be a ToF sensor (e.g. for direct and/or indirect ToF measurements). Alternatively, the optical sensor 120 may be a sensor of an active stereo camera or any other optical (e.g. infrared) camera (e.g. an Red Green Blue, RGB, sensor without infrared block filter, however, not all pixels need to be sensitive for infrared light). Accordingly, the optical sensor 120 may comprise processing circuitry configured to determine, based on the measured reflected infrared light 114' from the scene 190, at least one of an image of at least part of the scene 190 or a distance of the electronic device 110 to at least one object (such as the object 191) in the scene 190.

Although only one optical sensor 120 is illustrated in the example of FIG. 1, it is to be noted that an electronic device as proposed herein may optionally comprise plural (i.e. two or more) optical sensors. The at least one second light-emitting element 112-$i$ allows to illuminate the scene 190 for the plurality of optical sensors. For example, two active stereo sensors may be provided and a plurality of second light-emitting elements 112-$i$ may be used for flood illumination.

The at least one second light-emitting element 112-$i$ may be implemented in various ways. In the following some exemplary implementations will be described in detail. However, it is to be noted that the proposed technique is not limited thereto. Other suitable technologies may be used as well for the at least one second light-emitting element 112-$i$.

For example, the at least one second light-emitting element 112-$i$ may comprise/be a micro LED or a mini LED configured to emit the infrared light. Micro LEDs are of small size and exhibit a high illumination strength such that micro LEDs for illuminating the scene 190 can be placed between the first light-emitting elements 111-$i$ for displaying the optical image on the front side 113 of the display device 110 without requiring larger distances between the first light-emitting elements 111-$i$ compared to conventional displays. The same holds for mini LEDs.

In alternative examples, the at least one second light-emitting element 112-$i$ may comprise a micro LED or a mini LED configured to emit non-infrared light. For example, the micro LED may be configured to emit red, green or blue light. The at least one second light-emitting element 112-$i$ may further comprise a wavelength conversion element (device, structure) configured to convert the non-infrared light emitted by the micro LED or the mini LED to the infrared light 114. For example, a quantum dot or any other suitable element may be used as the wavelength conversion element. Also in this configuration, the at least one second light-emitting element 112-$i$ may exhibit a small size and a high illumination strength such that it can be placed between the first light-emitting elements 111-$i$ for displaying the optical image on the front side 113 of the display device 110 without requiring larger distances between the first light-emitting elements 111-$i$ compared to conventional displays.

In other examples, the at least one second light-emitting element 112-$i$ may comprise a Vertical-Cavity Surface-Emitting Laser (VCSEL) or any other type of laser diode that is configured to emit the infrared light 114. The at least one second light-emitting element 112-$i$ may further comprise an optical element (device, structure) configured to diffuse the infrared light 114 emitted by the VCSEL. For example, the optical element may comprise/be one or more optical lenses. A VCSEL delivers a good signal shape for, e.g., ToF applications. In order to widen the narrow light beam of the VCSEL, the optical element is used. Accordingly, an angle of the VCSEL's light beam can be increased to create a flood illuminator. Similarly, an optical element may be used for diffusing the light emitted by a micro LED or a mini LED.

In still other examples, the at least one second light-emitting element 112-$i$ may be a light-guiding element such as an optical wave guide or an optical fiber. In this example, a first end of the light-guiding element is configured to receive the infrared light 114 from a light-source (not illustrated) external to the display device 110. For example, the light-source may be arranged within the electronic device 100 at the back side of the display device 110. In other words, the display device 110 is arranged between the light-source and the scene 190. Further, a second end of the light-guiding element is configured to emit the infrared light 114 for illuminating the scene 190. Similar to what is described above for the VCSEL, an optical element may be formed on the second end of the light-guiding element to diffuse the infrared light 114 emitted by the second end of the light-guiding element. In other words, one or multiple light-guided illumination units, which has its opening(s) between the first light-emitting elements 111-$i$ may be used as the at least one second light-emitting element 112-$i$. For example, a laser (array) from which glass fibers or light guides transfer the light may be used. The end of the light guide may feature an optional light diffusion element which creates a flood illumination source between the display pixels.

Further, in case the display device 110 comprises a plurality of second light-emitting elements 112-$i$, the second light-emitting elements 112-$i$ may emit the infrared light 114 with different wavelengths. In other words, at least one of the plurality of second light-emitting elements 112-$i$ may be configured to emit the infrared light 114 with a first wavelength, and at least one other of the plurality of second light-emitting elements 112-$i$ may be configured to emit the infrared light 114 with a different second wavelength. For example, 850 nm, 1.1 µm and 1.4 µm may be used for the different wavelengths emitted by the plurality of second light-emitting elements 112-$i$. Emitting the infrared light 114 simultaneously with different wavelengths may be advantageous for applications that use ToF sensing (e.g. face recognition applications) as it reduces the vulnerability to spoofing.

The display device 110 may further comprise control circuitry (not illustrated) for controlling light-emission by the at least one second light-emitting element 112-$i$. The control circuitry may, e.g., be configured to control the at least one second light-emitting element 112-$i$ to emit the infrared light 114 synchronous to the light emission by the plurality of first light-emitting elements 111-$i$ for displaying the optical image on the front side 113 of the display device 110. For example, if a display refresh rate of the display device 110 for displaying the optical image is 90 Hz, the control circuitry may control the at least one second light-emitting element 112-$i$ to emit the infrared light 114 at every third frame such that the infrared light 114 is emitted at a rate of 30 Hz. In some examples, the pixel addressing logic used for controlling the first light-emitting elements 111-$i$ may be used as the control circuitry for the at least one second light-emitting element 112-$i$. In other examples, the control circuitry for the at least one second light-emitting element 112-$i$ may be different from control circuitry of the display device 110 for the plurality of first light-emitting element 111-$i$.

Similarly, the optical sensor 120 may be configured to measure the reflected infrared light 114' synchronous to the (display) refresh rate of the display device 110. For example, the (electronic) shutter of the optical sensor 120 may be operated synchronous to the refresh rate of the display device 110 (e.g. be 90 Hz, a fractional or a multiple thereof). Accordingly, the control circuitry may, e.g., be configured to control the at least one second light-emitting element 112-$i$ to emit the infrared light 114 synchronous to a shutter operation of the optical sensor 120. The at least one second light-emitting element 112-$i$ does not need to emit the infrared light 114 during all exposures of the optical sensor 120.

In case the optical sensor 120 is a ToF sensor (e.g. for direct or indirect ToF measurements), the infrared light 114 (optical signal) emitted by the at least one second light-emitting element 112-$i$ may be adapted to the ToF sensing requirements. In general, the infrared light 114 (optical signal) emitted by the at least one second light-emitting element 112-$i$ may be adapted to the sensing method used by the optical sensor 120.

The display device 110 is a display device which has an infrared illumination unit embedded. For example, as described above, micro LEDs may be used as they bear the desired illumination strength, while it is possible to seamlessly embed them into the pixel array of the display device. Any display technology may be used. Micro LED displays may be one option as these displays have comparatively large spaces between the RGB pixels due to the illumination strength of the individual micro LEDs.

Although not illustrated in FIG. 1, the electronic device 100 may optionally comprise further circuitry/elements such as, e.g., one or more microphones, one or more loudspeakers, one or more antennas, one or more application processors, one or more radio frequency transmitters and/or receivers for mobile communication, one or more data storages, one or more batteries, etc.

In the following some exemplary arrangement of a plurality of second light-emitting elements in the display device 110 will be described with reference to FIGS. 2 to 7. However, it is to be noted that display devices according to the proposed technique are not limited thereto. Any other suitable arrangement of a plurality of second light-emitting elements in the display device may be used as well.

Figure 2:
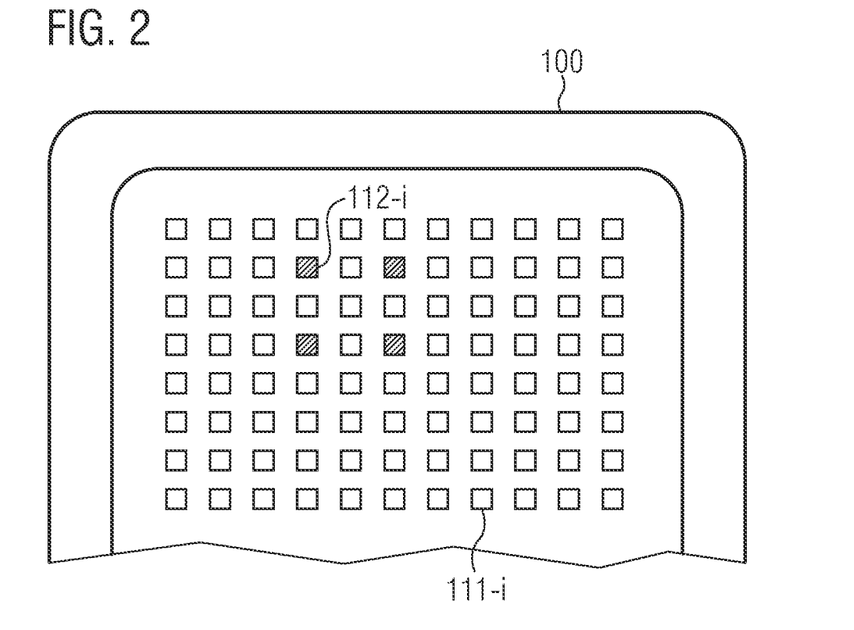
FIG. 2 illustrates a first exemplary arrangement of a plurality of second light-emitting elements.

FIG. 2 illustrates a first exemplary arrangement of a plurality of second light-emitting elements 112-$i$ in the display device 110. In the example of FIG. 2, four second light-emitting elements are illustrated for facilitating the description of the underlaying arrangement scheme. However, it is to be noted that more or less second light-emitting elements may be used as well.

In the example of FIG. 2, the plurality of first light-emitting elements 111-$i$ and the plurality of second light-emitting elements 112-$i$ are arranged adjacent to each other in rows and columns of an array. One first light-emitting element of the plurality of first light-emitting elements 111-$i$ is arranged between each two successive second light-emitting elements of the plurality of second light-emitting elements 112-$i$ in order to avoid larger dark spots on the display device 110. Optionally two or more first light-emitting element of the plurality of first light-emitting elements 111-$i$ may be arranged between each two successive second light-emitting elements.

In other words, some of the first light-emitting elements 111-$i$ are replaced in the array by second light-emitting elements 112-$i$. For example, if the first light-emitting elements 111-$i$ form RGB pixels for displaying the optical image, some of them may be replaced in the display array by, e.g., micro LEDs forming the second light-emitting elements 112-$i$.

In alternative examples, only an RGB sub-pixel of some of the RGB pixels may be replaced instead of the whole pixel as illustrated in FIG. 2. In this example, the plurality of first light-emitting elements 111-$i$ are arranged in rows and columns of an array similar to what is illustrated in FIG. 2. Each first light-emitting element of a first subset of the plurality of first light-emitting elements comprises two light-emitting sub-elements (circuitries, devices) each configured to emit a different one of red, blue and green light, and additionally a respective one of the plurality of second light-emitting elements. That is, each first light-emitting element of the first subset is only able to emit light in two different colors among the group of red, blue and green light. Each first light-emitting element of a second subset of the plurality of the first light-emitting elements comprises at least three light-emitting sub-elements each configured to emit a different one of red, blue and green light. The first light-emitting elements of the second subset do not comprise one of the plurality of second light-emitting elements.

Similarly to what is illustrated in FIG. 2, at least one first light-emitting element of the second subset may be arranged between each two successive first light-emitting elements of the first subset in order to avoid larger dark spots on the display device 110.

Figure 3:
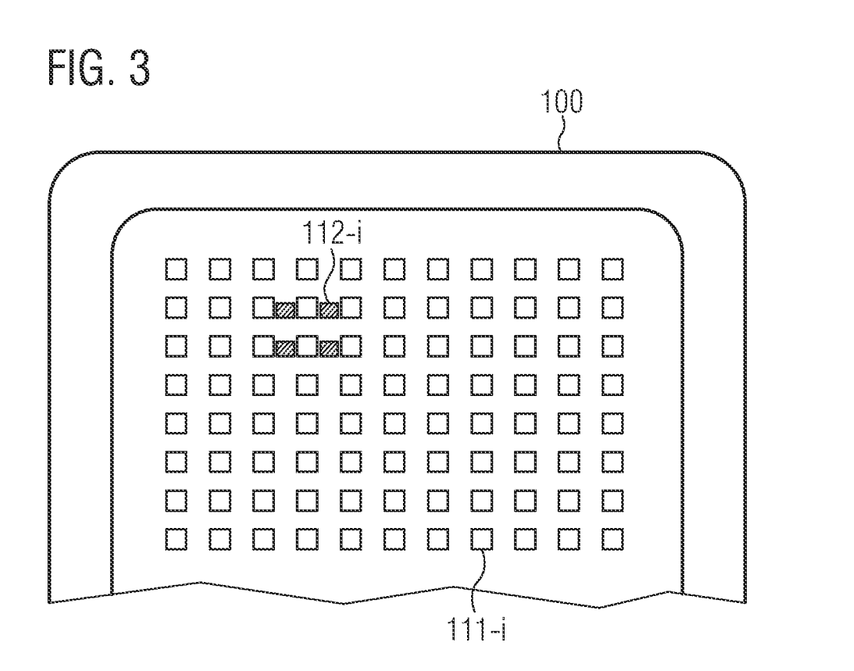
FIG. 3 illustrates a second exemplary arrangement of a plurality of second light-emitting elements.

FIG. 3 illustrates a second exemplary arrangement of a plurality of second light-emitting elements 112-$i$ in the display device 110. In the example of FIG. 3, four second light-emitting elements are again illustrated for facilitating the description of the underlaying arrangement scheme. However, it is to be noted that more or less second light-emitting elements may be used as well.

The plurality of first light-emitting elements 111-*i* are arranged in rows and columns of an array. In the example of FIG. 3, the plurality of second light-emitting elements 112-*i* are arranged in different lines of the array between columns of the array. In other words, the first and second light-emitting elements 111-*i*, 112-*i* are arranged according to respective arrays. A column of the array of the second light-emitting elements 112-*i* is arranged between two consecutive columns of the array of the first light-emitting elements 111-*i*. Further, a line of the array of the second light-emitting elements 112-*i* coincides with a line of the array of the first light-emitting elements 111-*i*.

Although not illustrated in FIG. 3, the plurality of second light-emitting elements 112-*i* may analogously be arranged in different columns of the array between lines of the array. For example, the first and second light-emitting elements 111-*i*, 112-*i* are arranged according to respective arrays. A line of the array of the second light-emitting elements 112-*i* is arranged between two consecutive lines of the array of the first light-emitting elements 111-*i*. Further, a column of the array of the second light-emitting elements 112-*i* coincides with a column of the array of the first light-emitting elements 111-*i*.

For example, if the first light-emitting elements 111-*i* form RGB pixels for displaying the optical image, micro LEDs forming the second light-emitting elements 112-*i* may be arranged between the RGB pixels.

Figure 4:
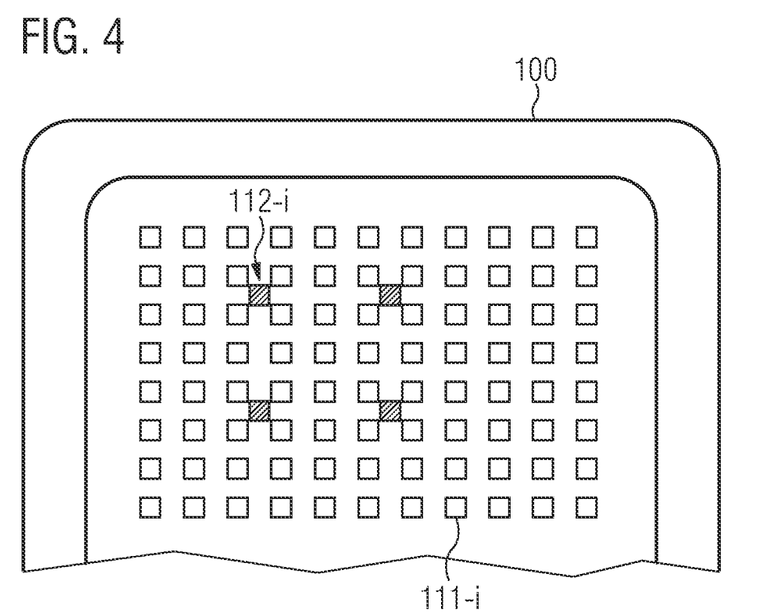
FIG. 4 illustrates a third exemplary arrangement of a plurality of second light-emitting elements.

FIG. 4 illustrates a third exemplary arrangement of a plurality of second light-emitting elements 112-*i* in the display device 110. In the example of FIG. 4, four second light-emitting elements are again illustrated for facilitating the description of the underlaying arrangement scheme. However, it is to be noted that more or less second light-emitting elements may be used as well.

The plurality of first light-emitting elements 111-*i* are again arranged in rows and columns of an array. In the example of FIG. 4, the plurality of second light-emitting elements 112-*i* are arranged between different lines of the array and between different columns of the array. In other words, the first and second light-emitting elements 111-*i*, 112-*i* are arranged according to respective arrays. A column, respectively a line of the array of the second light-emitting elements 112-*i* is arranged between two consecutive columns, respectively two consecutive lines of the array of the first light-emitting elements 111-*i*.

For example, if the first light-emitting elements 111-*i* form RGB pixels for displaying the optical image, micro LEDs forming the second light-emitting elements 112-*i* may be located between the RGB pixels. In further examples, positions of the RGB pixels may be slightly shifted to accommodate for the required space for the micro LEDs.

Figure 5:
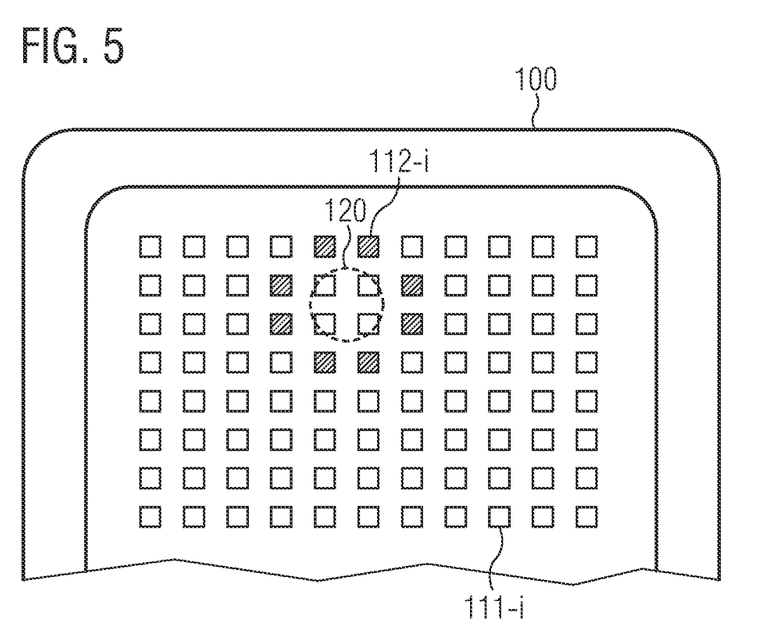
FIG. 5 illustrates a fourth exemplary arrangement of a plurality of second light-emitting elements.

FIG. 5 illustrates a fourth exemplary arrangement of a plurality of second light-emitting elements 112-*i* in the display device 110. In the example of FIG. 5, eight second light-emitting elements are illustrated for facilitating the description of the underlaying arrangement scheme. However, it is to be noted that more or less second light-emitting elements may be used as well.

The plurality of second light-emitting elements 112-*i* are arranged in a generally circular pattern. In particular, the circular pattern of second light-emitting elements 112-*i* surrounds a region of the display device 110 behind which the optical sensor 120 (in particular its imager) is arranged. Accordingly, shadows of the second light-emitting elements 112-*i* on the sensed object(s) may be minimized. It is to be noted that also other patterns may be used for the plurality of second light-emitting elements 112-*i* to surround the region of the display device 110 behind which the optical sensor 120 is arranged (e.g. a rectangle pattern or an irregular pattern).

In the example of FIG. 5, the plurality of first light-emitting elements 111-*i* and the plurality of second light-emitting elements 112-*i* are arranged adjacent to each other in rows and columns of an array. However, the proposed technique is not limited thereto. For example, similarly to what is described above for FIGS. 2 and 3, only the plurality of first light-emitting elements 111-*i* may be again arranged in rows and columns of the array, whereas the plurality of second light-emitting elements 112-*i* may be arranged in different lines of the array between columns of the array, or in different columns of the array between lines of the array, or between different lines of the array and between different columns of the array to form the circular pattern.

In other examples, a circular pattern of RGB pixels may be provided where one of the RGB sub-pixel is respectively replaced by one of the plurality of second light-emitting elements. That is, each first light-emitting element of a first subset of the plurality of first light-emitting elements may comprise two light-emitting sub-elements (circuitries, devices) each configured to emit a respective one of red, blue and green light, and additionally comprise a respective one of the plurality of second light-emitting elements. The first light-emitting elements of the first subset are arranged in a circular pattern. Each first light-emitting element of a second subset of the plurality of the first light-emitting elements comprises at least three light-emitting sub-elements each configured to emit a respective one of red, blue and green light. The first light-emitting elements of the second subset do not comprise one of the plurality of second light-emitting elements.

Figure 6:
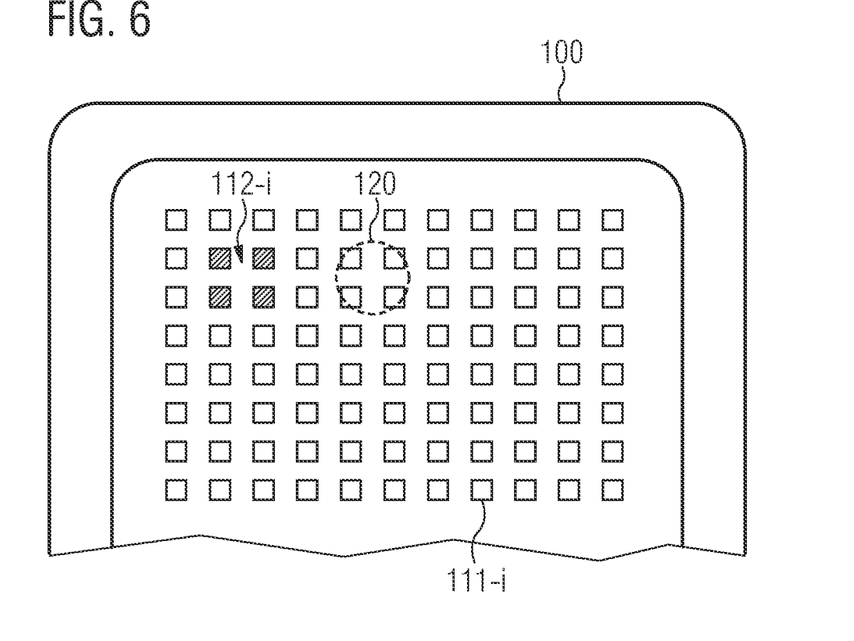
FIG. 6 illustrates a fifth exemplary arrangement of a plurality of second light-emitting elements.

FIG. 6 illustrates a fifth exemplary arrangement of a plurality of second light-emitting elements 112-*i* in the display device 110. In the example of FIG. 6, four second light-emitting elements are illustrated for facilitating the description of the underlaying arrangement scheme. However, it is to be noted that more or less second light-emitting elements may be used as well.

The plurality of second light-emitting elements 112-*i* are clustered, i.e. they are arranged as group in the display device 110. For example, the clustered second light-emitting elements 112-*i* may be placed next to a region of the display device 110 at which the optical sensor 120 (in particular its imager) is arranged at the backside of the display device 110. This may allow to facilitate control of the second light-emitting elements 112-*i* as the enable signal for all second light-emitting elements 112-*i* of the cluster may be provided via a single signal line from a control circuitry. Accordingly, a highly synchronized light emission of the second light-emitting elements 112-*i* in the cluster may be achieved. This may, in particular, be beneficial if a ToF sensor is used as the optical sensor 120.

In the example of FIG. 6, the plurality of first light-emitting elements 111-*i* and the plurality of second light-emitting elements 112-*i* are arranged adjacent to each other in rows and columns of an array. However, the proposed technique is not limited thereto. For example, similarly to what is described above for FIGS. 2 and 3, only the plurality of first light-emitting elements 111-*i* may be again arranged in rows and columns of the array, whereas the plurality of second light-emitting elements 112-*i* may be arranged in different lines of the array between columns of the array, or in different columns of the array between lines of the array, or between different lines of the array and between different columns of the array to form the circular pattern.

Figure 7:
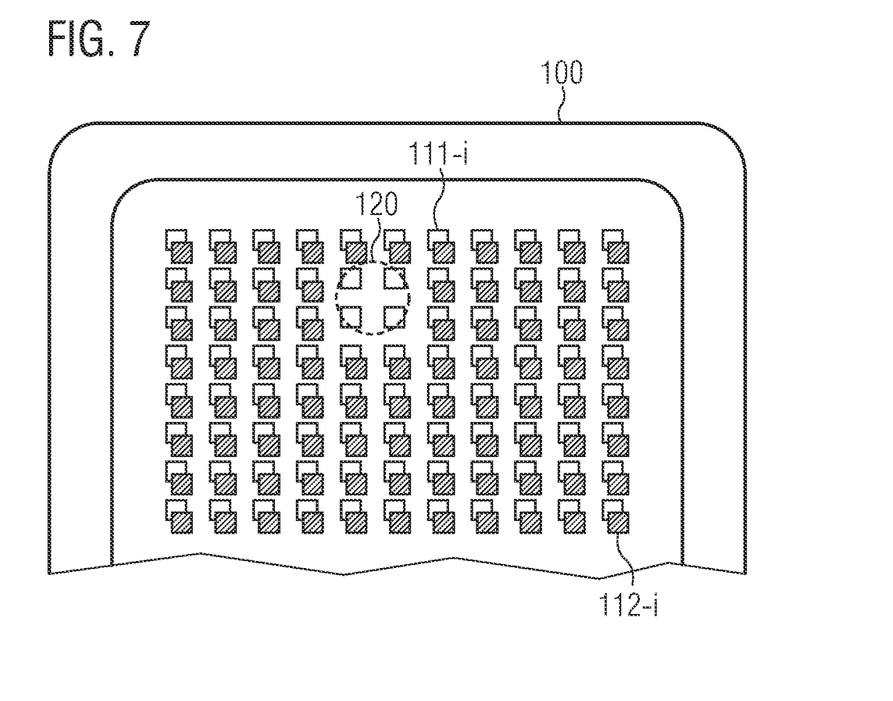
FIG. 7 illustrates a sixth exemplary arrangement of a plurality of second light-emitting elements.

FIG. 7 illustrates a sixth exemplary arrangement of a plurality of second light-emitting elements 112-*i* in the display device 110.

In this example, the plurality of first light-emitting elements 111-*i* are arranged in rows and columns of an array. Each first light-emitting element of a first subset of the plurality of first light-emitting elements 111-*i* comprises at least three light-emitting sub-elements each configured to (selectively) emit a different one of red, blue and green light, and additionally comprises a respective one of the plurality of second light-emitting elements 112-*i*. Further, each first light-emitting element of a second subset of the plurality of first light-emitting elements 111-*i* comprises at least three light-emitting sub-elements each configured to (selectively) emit a different one of red, blue and green light. The first light-emitting elements of the second subset do not comprise one of the plurality of second light-emitting elements.

For example, the first light-emitting elements of the second subset may be arranged at a region of the display device 110 at which the optical sensor 120 (in particular its imager) is arranged at the backside of the display device 110. The first light-emitting elements of the first subset may be arranged in the remaining region of the display device 110 so as to surround the region of the display device 110 at which the optical sensor 120 is arranged at the backside of the display device 110. Accordingly, shadows of the second light-emitting elements 112-*i* on the sensed object(s) and stray light (i.e. light reflected by the optical sensor 120) may be minimized.

According to examples of the present disclosure, the first light-emitting elements of the first subset are not implemented as simple RGB pixels but as RGB-Infrared pixels. The display region covering the optical sensor does not feature infrared pixels to increase transparency and limit stray light.

In other examples, each RGB pixel may feature and additional infrared sub-pixel. That is, the plurality of first light-emitting elements are again arranged in rows and columns of an array similar to what is illustrated in FIG. 7. However, in contrast to what is illustrated in FIG. 7, each of the plurality of first light-emitting elements comprises at least three light-emitting sub-elements each configured to emit a different one of red, blue and green light, and additionally a respective one of the plurality of second light-emitting elements.

The examples as described herein may be summarized as follows:

Some examples relate to a display device. The display device comprises a plurality of first light-emitting elements configured to emit light for displaying an optical image on a front side of the display device. Additionally, the display device comprises at least one second light-emitting element configured to emit infrared light for illuminating a scene in front of the front side of the display device.

In some examples, the at least one second light-emitting element comprises a micro light emitting diode or a mini light emitting diode configured to emit the infrared light.

In alternative examples, the at least one second light-emitting element comprises: a micro light emitting diode or a mini light emitting diode configured to emit non-infrared light; and a wavelength conversion element configured to convert the non-infrared light emitted by the micro light emitting diode or the mini light emitting diode to the infrared light.

According to some examples, the wavelength conversion element is a quantum dot.

In further alternative examples, the at least one second light-emitting element comprises: a vertical-cavity surface-emitting laser, a micro light emitting diode or a mini light emitting diode configured to emit the infrared light; and an optical element configured to diffuse the infrared light emitted by the vertical-cavity surface-emitting laser, the micro light emitting diode or the mini light emitting diode.

In still further alternative examples, the at least one second light-emitting element is a light-guiding element, wherein a first end of the light-guiding element is configured to receive the infrared light from a light-source external to the display device, and wherein a second end of the light-guiding element is configured to emit the infrared light for illuminating the scene.

According to some examples, an optical element is formed on the second end of the light-guiding element and configured to diffuse the infrared light emitted by the second end of the light-guiding element.

In some examples, the display device comprises a plurality of second light-emitting elements, wherein the plurality of first light-emitting elements are arranged in rows and columns of an array, and wherein the plurality of second light-emitting elements are arranged: in different lines of the array between columns of the array; or in different columns of the array between lines of the array; or between different lines of the array and between different columns of the array.

In alternative examples, the display device comprises a plurality of second light-emitting elements, wherein the plurality of first light-emitting elements and the plurality of second light-emitting elements are arranged adjacent to each other in rows and columns of an array.

According to some examples, at least one first light-emitting element of the plurality of first light-emitting elements is arranged between each two successive second light-emitting elements of the plurality of second light-emitting elements.

In further alternative examples, the display device comprises a plurality of second light-emitting elements, wherein the plurality of first light-emitting elements are arranged in rows and columns of an array, wherein each first light-emitting element of a first subset of the plurality of first light-emitting elements comprises: either two light-emitting sub-elements each configured to emit a different one of red, blue and green light or at least three light-emitting sub-elements each configured to emit a different one of red, blue and green light; and a respective one of the plurality of second light-emitting elements, wherein each first light-emitting element of a second subset of the plurality of first light-emitting elements comprises at least three light-emitting sub-elements each configured to emit a different one of red, blue and green light, wherein the first light-emitting elements of the second subset do not comprise one of the plurality of second light-emitting elements.

According to some examples, at least one first light-emitting element of the second subset is arranged between each two successive first light-emitting elements of the first subset.

In some examples, the plurality of second light-emitting elements are arranged in a circular pattern.

In alternative examples, the plurality of second light-emitting elements are clustered.

According to some examples, the display device comprises a plurality of second light-emitting elements, wherein the plurality of first light-emitting elements are arranged in rows and columns of an array, wherein each of the plurality of first light-emitting elements comprises: at least three light-emitting sub-elements each configured to emit a different one of red, blue and green light; and a respective one of the plurality of second light-emitting elements.

In some examples, the display device comprises a plurality of second light-emitting elements, wherein at least one of the plurality of second light-emitting elements is configured to emit the infrared light with a first wavelength, and wherein at least one other of the plurality of second light-emitting elements is configured to emit the infrared light with a different second wavelength.

According to some examples, the display device further comprises control circuitry configured to control the at least one second light-emitting element to emit the infrared light synchronous to the light emission by the plurality of first light-emitting elements.

Other examples relate to an electronic device. The electronic device comprises a display device as proposed herein and at least one optical sensor configured to measure reflected infrared light from the scene. The display device is arranged between the at least one optical sensor and the scene.

In some examples, the at least one optical sensor is a time-of-flight sensor.

According to some examples, the at least one optical sensor comprises processing circuitry configured to determine, based on the reflected infrared light from the scene, at least one of an image of at least part of the scene or a distance of the electronic device to at least one object in the scene.

In some examples, the optical sensor is configured to measure the reflected infrared light synchronous to a refresh rate of the display device.

According to some examples, the electronic device comprises a plurality of optical sensors.

In some examples, the electronic device is one of a smartphone, a tablet-computer and a laptop-computer.

Examples of the present disclosure may provide an infrared camera illumination unit embedded in display. For example, small infrared LEDs may be integrated into a display device in order to use them as illumination source for image sensors behind the display.

The aspects and features described in relation to a particular one of the previous examples may also be combined with one or more of the further examples to replace an identical or similar feature of that further example or to additionally introduce the features into the further example.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A display device, comprising:
   a plurality of first light-emitting elements configured to emit light for displaying an optical image on a front side of the display device; and
   at least one second light-emitting element configured to emit infrared light for illuminating a scene in front of the front side of the display device.

2. The display device of claim 1, wherein the at least one second light-emitting element comprises a micro light emitting diode or a mini light emitting diode configured to emit the infrared light.

3. The display device of claim 1, wherein the at least one second light-emitting element comprises:
   a micro light emitting diode or a mini light emitting diode configured to emit non-infrared light; and
   a wavelength conversion element configured to convert the non-infrared light emitted by the micro light emitting diode or the mini light emitting diode to the infrared light.

4. The display device of claim 1, wherein the at least one second light-emitting element comprises:
   a vertical-cavity surface-emitting laser, a micro light emitting diode or a mini light emitting diode configured to emit the infrared light; and
   an optical element configured to diffuse the infrared light emitted by the vertical-cavity surface-emitting laser, the micro light emitting diode or the mini light emitting diode.

5. The display device of claim 1, wherein the at least one second light-emitting element is a light-guiding element, wherein a first end of the light-guiding element is configured to receive the infrared light from a light-source external to the display device, and wherein a second end of the light-guiding element is configured to emit the infrared light for illuminating the scene.

6. The display device of claim 1, wherein the display device comprises a plurality of second light-emitting elements, wherein the plurality of first light-emitting elements are arranged in rows and columns of an array, and wherein the plurality of second light-emitting elements are arranged:
   in different lines of the array between columns of the array; or
   in different columns of the array between lines of the array; or
   between different lines of the array and between different columns of the array.

7. The display device of claim 6, wherein the plurality of second light-emitting elements surround a region of the display device behind which an optical sensor is arranged.

8. The display device of claim 6, wherein the plurality of second light-emitting elements are clustered.

9. The display device of claim 1, wherein the display device comprises a plurality of second light-emitting elements, and wherein the plurality of first light-emitting elements and the plurality of second light-emitting elements are arranged adjacent to each other in rows and columns of an array.

10. The display device of claim 9, wherein at least one first light-emitting element of the plurality of first light-emitting elements is arranged between each two successive second light-emitting elements of the plurality of second light-emitting elements.

11. The display device of claim 9, wherein the plurality of second light-emitting elements surround a region of the display device behind which an optical sensor is arranged.

12. The display device of claim 9, wherein the plurality of second light-emitting elements are clustered.

13. The display device of claim 1, wherein the display device comprises a plurality of second light-emitting elements, wherein the plurality of first light-emitting elements are arranged in rows and columns of an array, wherein each first light-emitting element of a first subset of the plurality of first light-emitting elements comprises:
- either two light-emitting sub-elements each configured to emit a different one of red, blue and green light or at least three light-emitting sub-elements each configured to emit a different one of red, blue and green light; and
- a respective one of the plurality of second light-emitting elements,
- wherein each first light-emitting element of a second subset of the plurality of first light-emitting elements comprises at least three light-emitting sub-elements each configured to emit a different one of red, blue and green light, and wherein the first light-emitting elements of the second subset do not comprise one of the plurality of second light-emitting elements.

14. The display device of claim 13, wherein at least one first light-emitting element of the second subset is arranged between each two successive first light-emitting elements of the first subset.

15. The display device of claim 13, wherein the plurality of second light-emitting elements surround a region of the display device behind which an optical sensor is arranged.

16. The display device of claim 13, wherein the plurality of second light-emitting elements are clustered.

17. The display device of claim 1, wherein the display device comprises a plurality of second light-emitting elements, wherein the plurality of first light-emitting elements are arranged in rows and columns of an array, wherein each of the plurality of first light-emitting elements comprises:
- at least three light-emitting sub-elements each configured to emit a different one of red, blue and green light; and
- a respective one of the plurality of second light-emitting elements.

18. The display device of claim 1, wherein the display device comprises a plurality of second light-emitting elements, wherein at least one of the plurality of second light-emitting elements is configured to emit the infrared light with a first wavelength, and wherein at least one other of the plurality of second light-emitting elements is configured to emit the infrared light with a different second wavelength.

19. An electronic device, comprising:
- the display device of claim 1; and
- at least one optical sensor configured to measure reflected infrared light from the scene,
- wherein the display device is arranged between the at least one optical sensor and the scene.

20. The electronic device of claim 19, wherein the at least one optical sensor is a time-of-flight sensor.

* * * * *